United States Patent
Dohnke et al.

(10) Patent No.: US 6,373,318 B2
(45) Date of Patent: Apr. 16, 2002

(54) ELECTRONIC SWITCHING DEVICE HAVING AT LEAST TWO SEMICONDUCTOR COMPONENTS

(75) Inventors: Karl-Otto Dohnke, Memmelsdorf; Heinz Mitlehner, Uttenreuth; Dietrich Stephani, Bubenreuth; Benno Weis, Hemhofen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/817,574

(22) Filed: Mar. 26, 2001

Related U.S. Application Data

(63) Continuation of application No. PCT/DE99/02924, filed on Sep. 14, 1999.

(30) Foreign Application Priority Data

Sep. 25, 1998 (DE) .......................... 198 44 130

(51) Int. Cl.$^7$ .............................................. H03K 17/687
(52) U.S. Cl. .................... 327/427; 327/430; 327/434
(58) Field of Search ...................... 327/427, 430–437, 327/374, 376, 377

(56) References Cited

U.S. PATENT DOCUMENTS

| | | | |
|---|---|---|---|
| 4,317,055 A | 2/1982 | Yoshida et al. | 327/541 |
| 4,394,590 A | 7/1983 | Honda | 327/436 |
| 4,523,111 A | 6/1985 | Baliga | 327/388 |
| 4,645,957 A | * 2/1987 | Baliga | 327/430 |
| 4,929,855 A | * 5/1990 | Ezzeddine | 327/427 |
| 4,945,266 A | 7/1990 | Mori | 327/427 |
| 5,012,123 A | * 4/1991 | Ayasli | 327/427 |
| 5,396,085 A | 3/1995 | Baliga | 357/77 |
| 5,406,096 A | 4/1995 | Malhi | 257/114 |
| 6,091,276 A | * 7/2000 | Aiello et al. | 327/433 |
| 6,255,890 B1 | * 7/2001 | Aiello et al. | 327/432 |

FOREIGN PATENT DOCUMENTS

| | | |
|---|---|---|
| DE | 34 07 975 C2 | 9/1984 |
| EP | 0 822 600 A1 | 2/1998 |
| JP | 61 161 015 | 7/1986 |
| JP | 62 239 719 | 10/1987 |
| WO | WO 97/34322 | 9/1997 |

\* cited by examiner

*Primary Examiner*—Toan Tran
(74) *Attorney, Agent, or Firm*—Herbert L. Lerner; Laurence A. Greenberg; Werner H. Stemer

(57) ABSTRACT

An electronic switching device includes at least one first and one second semiconductor component, with a first anode connection and a second cathode connection being short-circuited. A control voltage that can be applied to a first grid connection is also at least partially present at a second grid connection. This reduces the forward resistance of the electronic switching device in the switched-on state.

23 Claims, 5 Drawing Sheets

Electronic Switching Device

ELECTRONIC SWITCHING DEVICE HAVING AT LEAST TWO SEMICONDUCTOR COMPONENTS

CROSS-REFERENCE TO RELATED APPLICATION

This application is a continuation of International Application No. PCT/DE99/02924, filed Sep. 14, 1999, which designated the United States.

BACKGROUND OF THE INVENTION

Field of the Invention

The invention relates to an electronic switching device. The electronic switching device includes a first semiconductor component. The first semiconductor component has a first cathode connection, a first anode connection, and a first grid connection. The electronic switching device further includes a second semiconductor component. The second semiconductor component has a second cathode connection, a second anode connection and a second grid connection. The first anode connection and the second cathode connection are electrically short-circuited.

Such an electronic switching device is known from WO 97/34322 A1 corresponding to commonly-owned U.S. Pat. No. 6,157,049, and from U.S. Pat. No. 5,396,085. The respectively disclosed electronic switching device also includes an electrically conductive connection between the first cathode connection and the second grid connection. This interconnection of two semiconductor components is also referred to as a cascode circuit. The electronic switching device is used for switching high electric current, and is also configured for a high reverse voltage. The first semiconductor component is made of silicon (Si) and, owing to the high charge carrier mobility in the silicon, ensures a high switching speed. The second semiconductor component is composed of a semiconductor material having a breakdown field strength of more than $10^6$ V/cm, in particular of silicon carbide (SiC), and ensures a high reverse voltage.

In contrast, an electronic switching device that is produced using only silicon, for example a voltage-controlled Si-MOSFET (Metal Oxide Semiconductor Field Effect Transistor), has steady-state losses in the switched-on state which rise with the reverse voltage which has to be coped with by the Si-MOSFET in the switched-off state. In silicon, the steady-state power loss of a power MOSFET configured for a reverse voltage of more than 600 V is excessive for a forward current of more than 5 A. For this reason, Si-MOSFETs are no longer used, despite the high switching speed, for applications with a reverse voltage and a forward current in the said order of magnitude.

According to WO 97/34322 A1, the first semiconductor component is composed of Si and, overall, for a given polarity of the operating voltage, the electronic switching device also can be switched between a switched-on state and a switched-off state using a control voltage that is present at the first grid connection. When the electronic switching device is switched off, a depletion zone (zone with a reduced number of charge carriers and thus a high electrical resistance; space-charge zone) of at least one p-n junction constricts at least one channel region of the semiconductor component, which is composed of SiC. The majority of the operating voltage which is to be switched off and is applied between the first cathode connection and the second anode connection is dropped across this depletion zone. Owing to the high breakdown field strength of the silicon carbide that is used, the p-n junction, in particular its depletion zone, can withstand a considerably greater reverse voltage than a p-n junction formed from silicon and with the same charge carrier concentrations and dimensions. Because the majority of the reverse voltage is dropped within the second semiconductor component, the first semiconductor component thus need be configured only for the remaining part of the reverse voltage. This results in considerably reduced power losses in the first semiconductor component, which is composed of silicon, when switched on.

When switched on, the depletion zone of the p-n junction in the second semiconductor component is flooded with charge carriers, and the channel region is opened. An electric current now can flow through the channel region. The total power loss in the electronic switching device then includes the losses in the first and second semiconductor component. These total losses are now considerably less than those with a pure silicon semiconductor component configured for the same reverse voltage.

Integration of the two semiconductor components to form a hybrid semiconductor structure is also known from WO 97/34322 A1. The metallization, which is applied to the entire area of the surface of the second semiconductor component composed of SiC, for the second cathode connection is in this case at the same time used as the metallization for the first anode connection of the first semiconductor component, which is composed of Si.

A similar electronic switching device have a cascode circuit formed by a first semiconductor component composed of Si and a second semiconductor component composed of SiC is known from U.S. Pat. No. 5,396,085. One difference, however, is the use of a composite substrate, which contains not only an area composed of silicon but also an area composed of silicon carbide. The two semiconductor components are each produced in one of these areas of the composite substrate.

Furthermore, a cascode circuit formed from a normally-off MOSFET composed of silicon and an SIT (Stated Induction Transistor) composed of a composite semiconductor, for example of gallium arsenide (GaAs) or indium phosphide (InP) is also known from JP 61-161015 A1. This electronic device is in this case primarily used for extremely fast switching for a radio-frequency application.

In general, in the described cascode circuit, the forward resistance of the first semiconductor component has a negative-feedback effect to the second grid connection of the second semiconductor component. As the current through the electronic switching device increases, the negative bias voltage on the second grid connection also rises in comparison to the second cathode connection. The depletion zone of the p-n junction, which is located between the two connections, is thus further enlarged into the channel region intended for the current flow. Thus, as the current through the electronic switching device rises, the forward resistance of the second semiconductor component is increased, however.

In order to at least partially overcome this effect, the electrical switching device disclosed in German patent DE 34 07 975 C2, corresponding to U.S. Pat. No. 4,523,111, provides for a p-n junction in the second semiconductor component to be appropriately biased. This p-n junction is located between the second grid connection and the second cathode connection within the second semiconductor component, which is in the form of a junction field-effect transistor (JFET). The bias voltage is in this case dimensioned such that the p-n junction, and thus also the JFET overall, are in a bipolar conduction state. The bias voltage is thus greater than the diffusion voltage of this p-n junction. For silicon, the diffusion voltage is in the order of magnitude of 0.6 to 0.7 V. For bipolar operation of the p-n junction, the second semiconductor component is now no longer driven without any power consumption. A current flows via the p-n junction. Owing to this current flow, the second grid connection needs to be configured to be more stable and, in particular, also larger, as a result of which space is lost for the actual active area of the second semiconductor component. This reduces the current switching capacity of the electrical switching device. The current flow at the second grid connection furthermore leads to a capacitance of the p-n junction first of all having to be charged up or having its charge reversed when a switching process is initiated. The achievable switching speed thus also falls.

SUMMARY OF THE INVENTION

It is accordingly an object of the invention to provide an electronic switching device having at least two semiconductor components that overcomes the hereinafore-mentioned disadvantages of the heretofore-known devices of this general type and that has a low forward resistance and, at the same time, a good current switching capacity and a high switching speed.

With the foregoing and other objects in view, there is provided, in accordance with the invention, an electronic switching device. The electronic switching device includes a first semiconductor component and a second semiconductor component. The first semiconductor component has a first cathode connection, a first anode connection, and a first grid connection. The first grid connection receives a control voltage. The second semiconductor component has a second cathode connection, a second anode connection, a second grid connection, and a p-n junction located between the second grid connection and the second cathode connection. The p-n junction has a diffusion voltage. The second grid connection also receives a part of the control voltage. The part of the control voltage is applied to the second grid connection and produces a grid-cathode voltage of the second semiconductor component. The grid-cathode voltage of the second semiconductor component always is kept less than the diffusion voltage of the p-n junction by manipulating the part of the control voltage received by the second grid connection. The first anode connection and the second cathode connection are electrically short-circuited.

In the electronic switching device, the invention provides that a control voltage that can be applied to the first grid connection is also partially present at the second grid connection. In which case, the part of the control voltage which is applied to the second grid connection is dimensioned such that a grid-cathode voltage of the second semiconductor component is always less than a diffusion voltage of a p-n junction that is located between the second grid connection and the second cathode connection within the second semiconductor component.

The invention is in this case based on the knowledge that the advantageous effect of the first and second semiconductor components, with their respective specific advantages, also can be achieved if the second grid connection is not short-circuited to the first cathode connection. Disconnection of this electrical connection provided in the prior art also offers the advantage that the negative-feedback effect of the forward resistance of the first semiconductor component to the second semiconductor component can be avoided with a consequent increase in the forward resistance of the second semiconductor component. This decoupling means that the forward resistance of the second semiconductor component in the rated current region is essentially independent of any electric current flowing via the electronic switching device. The partial coupling of the control voltage that is present at the first grid connection to the second grid connection means, specifically, that a depletion zone which is caused by a diffusion voltage in a channel region in the second semiconductor component is considerably reduced, thus resulting in the reduced forward resistance. As the forward resistance of the second semiconductor component falls, the total forward resistance of the electronic switching device is also reduced.

As a result of the fact that the part of the control voltage which is applied to the grid connection results in a grid-cathode voltage in the second semiconductor component which is always less than the diffusion voltage, means that the p-n junction is also not switched to the bipolar state. That is to say, the p-n junction is not switched to the conductive state. No significant current flow takes place at the second grid connection. This results in a very low forward resistance with the current switching capacity remaining equally good, and the switching speed likewise being equally fast. The drive advantageously takes place, as before, without any power, so that the dimensioning of the second grid connection can remain equally small. Furthermore, no significant bipolar injection into the p-n junction occurs.

The measure of applying a part of the control voltage that is present at the first grid connection to the second grid connection as well means that the reverse-voltage capacity of the electronic switching device is not adversely affected in any way. Since, in particular, a control voltage of 0 V is required at the first grid connection for switching to the switched-off state, the second grid connection is thus also virtually at the same potential as the first cathode connection. However, this means that relationships that are comparable to those in the prior art exist in the switched-off state. The positive control voltage required for switching to the switched-on state at the same time, however, owing to the partial coupling to the second grid connection also results in an improved current carrying capacity in the channel region for the current flow in the second semiconductor component. In the switched-off state, this channel region is constricted, as in the prior art, by a depletion zone, with the overall depletion zone bearing a large proportion of the reverse voltage that is present across the electronic switching device.

In one particularly advantageous embodiment, the part of the control voltage that is applied to the grid connection leads to a grid-cathode voltage with a value of at most two-thirds of the diffusion voltage of the p-n junction. This p-n junction is located between the second grid connection and the second cathode connection within the second semiconductor component. This additional safety margin for the diffusion voltage further reduces the current flow, which is already low in any case, via the p-n junction.

The electrical partial coupling of the potentials at the two grid connections can advantageously be achieved using a first electrical coupling resistance connected between the two grid connections. The dimensioning of this first coupling resistance allows the proportion of the control voltage that is present at the first grid connection and is intended to be dropped at the second grid connection to be set well. This setting can be made even more exactly if, as in a further advantageous embodiment, the proportion of the control voltage that is dropped at the second grid connection is tapped off via a voltage divider that is connected between the first grid connection and the first cathode connection. This voltage divider includes a first and a second coupling resistance.

In order to improve the dynamic response, one advantageous refinement provides for a first diode to be connected in parallel with the first coupling resistance, and a second diode to be connected in parallel with the second coupling resistance. In consequence, when switching between the switched-off state and the switched-on state, the charging or discharging process of a capacitor between the second grid connection and the second cathode connection is hastened.

In one preferred embodiment, the first coupling resistance or the voltage divider is purely resistive.

However, another type of impedance, for example a capacitive impedance or any complex impedance, is also possible.

In one embodiment, the first semiconductor component is advantageously produced using the semiconductor material silicon. Owing to its high charge carrier mobility, silicon allows a very high switching speed.

A further advantageous refinement provides for the first semiconductor component to be in the form of a normally-off MOSFET. In this case, the first semiconductor component can be switched to the switched-on state via a voltage that is present at the first grid connection. The first grid connection in this embodiment corresponds to the gate electrode of the MOSFET. A normally-off MOSFET with an n-conductive channel is preferable. This allows the MOSFET to be switched from the switched-off state to the switched-on state via a positive control voltage.

In another embodiment, the second semiconductor component is advantageously produced using a semiconductor material having a breakdown field strength of at least $10^6$ V/cm. This results in the high reverse voltage capacity required by the second semiconductor component in the switched-off state. Suitable semiconductor materials are diamond, aluminum nitride (AlN), gallium nitride (GaN), indium nitride (InN) and, in particular, silicon carbide (SiC). For the latter, the polytypes 3C-, 4H-, 6H-, and 15R-SiC are particularly suitable.

A further advantageous embodiment includes a second semiconductor component that is in the form of a normally-on field-effect transistor. This allows the current flowing via the electronic switching device to be controlled very easily and quickly just by a switching operation in the first semiconductor component.

The normally-on field-effect transistor is preferably in the form of a junction field effect transistor (JFET). In this type of transistor, the current flow through a depletion layer that can be influenced externally, in particular a depletion zone for example of a p-n junction, is controlled. The physical extent of this depletion zone then governs the magnitude of the current flowing. Depending on the voltage that is present at the second grid connection, the depletion zone then opens or constricts a channel region with a greater or lesser width for the current flow.

The following refinements are preferred embodiments of the junction field-effect transistor (JFET).

In a first refinement, the JFET includes an n-conductive first semiconductor region. On one surface of this first semiconductor region there is a contact region that is likewise n-conductive within the first semiconductor region. This contact region can be doped to the same extent or else to a greater extent than the rest of the first semiconductor region. It is made contact with electrically, in particular resistively, via the second cathode connection. An area of the surface of the first semiconductor region located outside the contact region is made contact with electrically via the second grid connection. This contact may not only be resistive but may also be in the form of a Schottky contact. It is possible for a number of contact regions as well as a number of areas located outside these contact regions to be provided, which are then each made contact with by the second cathode connection or the second grid connection. The first semiconductor region is made contact with electrically, in particular resistively, via the second anode connection, on a side facing away from that surface. Because the current flows vertically between the second cathode connection and the second anode connection, that is to say at right angles to the surface, through the second semiconductor component, it is also referred to as a vertical JFET.

In a second refinement, a p-conductive second semiconductor region is located on the surface within the first semiconductor region. This second semiconductor region is so highly doped that the second grid connection forms a resistive contact. It is also possible for the JFET to contain a number of second semiconductor regions. A p-n junction with a depletion zone is formed between the n-conductive first semiconductor region and, possibly, also the likewise n-conductive contact region on the one hand, and the p-conductive second semiconductor region on the other hand. This depletion zone forms the boundary layer in the JFET, which can be controlled via the second grid connection. A channel running within the first channel region is constricted or even completely covered by this depletion zone by applying an appropriate voltage to the second grid connection.

In particular, a third refinement is also advantageous, which includes a p-conductive island region buried within the first semiconductor region. A number of these buried island regions also optionally may be provided. The buried p-conductive island region is, in this case, disposed in particular such that, in a projection at right angles to the surface, the projection of the contact region is located completely within the projection of the buried island region. This results in a lateral n-conductive channel region: that is, a region running parallel to the surface, within the first semiconductor region. This is bounded by the depletion zones of the p-n junction between the first and second semiconductor regions on the one hand, and a further p-n junction between the first semiconductor region and the buried island region on the other hand. Particularly when switched off, the buried island region offers advantages, because that part of the p-n junction to the first semiconductor region which is located underneath the buried island region can absorb the majority of the reverse voltage.

In a further refinement, the buried island region is also electrically conductively connected to the second grid connection. The depletion zones of the p-n junctions between the two said p-conductive zones and the n-conductive first semiconductor region thus can be controlled jointly via the second grid connection.

Another advantageous embodiment of the electronic switching device envisages integration of the first and second semiconductor components to form a hybrid semiconductor structure. In this case, the electrode layer of the first anode connection and of the second cathode connection is used, in particular, as the connecting element between the two semiconductor components. Because both connections are short-circuited, they can be produced by a single electrode layer, which extends over the entire surface area of the hybrid semiconductor structure, between the first and second semiconductor components in the hybrid semiconductor structure. This configuration avoids mechanical stresses at the interface between the two semiconductor components, which occur in particular when the two semiconductor components are composed of different semiconductor materials and these different semiconductor materials come into contact with one another at the interface.

Other features which are considered as characteristic for the invention are set forth in the appended claims.

Although the invention is illustrated and described herein as embodied in an electronic switching device having at least two semiconductor components, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
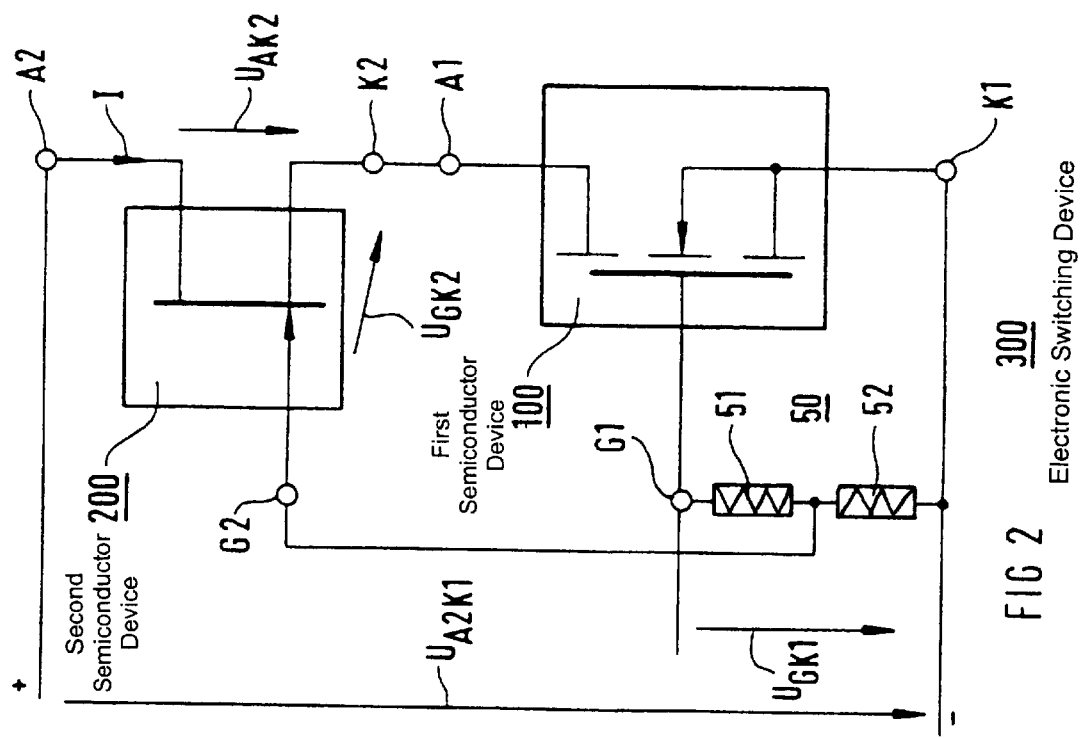
FIG. 2 is a partial schematic diagram/partial block diagram showing a second electronic switching device having a first and a second semiconductor component.

In all the figures of the drawing, sub-features and integral parts that correspond to one another bear the same reference symbol in each case.

Figure 1:
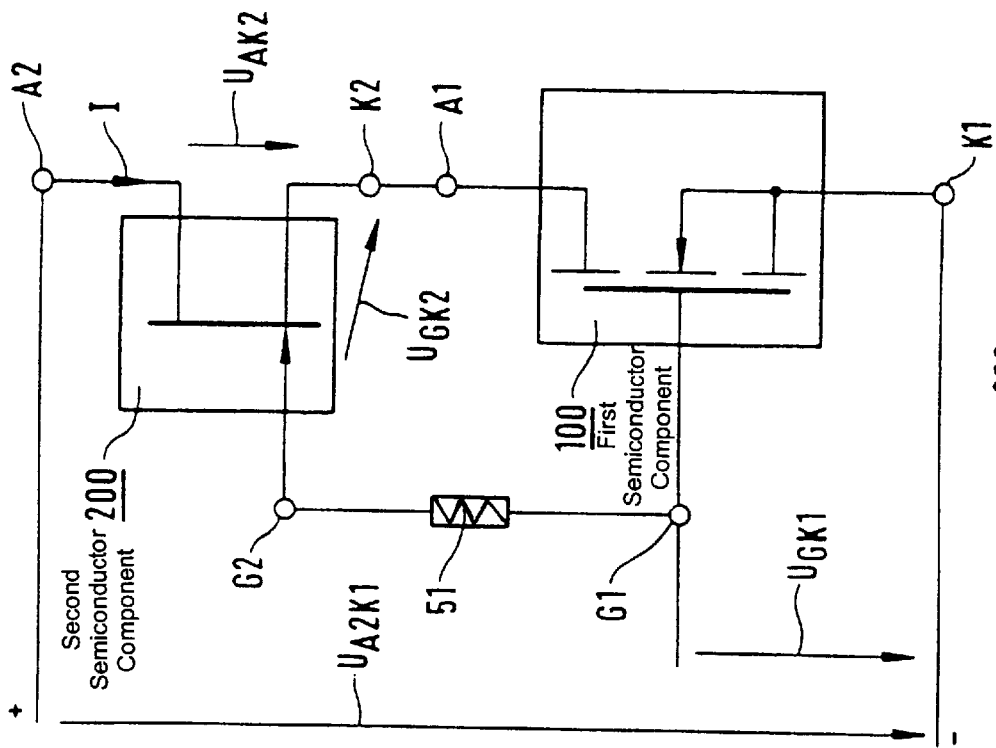
FIG. 1 is a partial schematic diagram/partial block diagram showing a first electronic switching device having a first and a second semiconductor component.

Referring now to the figures of the drawings in detail and first, particularly to FIG. 1 thereof, there is shown a first exemplary embodiment for an electronic switching device 300. The electronic switching device 300 includes a first semiconductor component 100 and a second semiconductor component 200. The first semiconductor component 100 is in the form of a normally-off Si-MOSFET, and the second semiconductor component 200 is in the form of an SiC-JFET. The first semiconductor component 100 has a first anode connection A1, a first cathode connection K1, and a first grid connection G1. The second semiconductor component 200 has a second anode connection A2, a second cathode connection K2, and a second grid connection G2. The first anode connection A1 and the second cathode connection K2 are electrically short-circuited.

The electronic switching device 300 is used for low-loss and fast electronic switching of an electrical operating voltage $U_{A2K1}$ which is present between the second anode connection A2 and the first cathode connection K1, or of a current I flowing via the electronic switching device 300. If, as shown in FIG. 1, a positive operating voltage $U_{A2K1}$ is applied, that is, the second anode connection A2 is at a positive potential when compared to the first cathode connection, then the electronic switching device 300 can switch between a switched-off state and switched-on state.

This switching takes place via a control voltage $U_{GK1}$ that can be applied between the first grid connection G1 and the first cathode connection. Because the first semiconductor component 100 is a normally-off Si-MOSFET with an n-conductive channel, a positive control voltage $U_{GK1}$ causes the first semiconductor component 100 to open, and a control voltage $U_{GK1}$ of 0 V causes it to close.

A portion of the control voltage $U_{GK1}$ is passed via a first coupling resistance 51 to the second grid connection G2. This reduces the forward resistance of the second semiconductor component 200 when it is switched on, and thus also that of the entire electronic switching device 300. The first coupling resistance 51 can in this case be dimensioned such that the product of the capacitive charging current flowing via the second grid connection G2 and the first coupling resistance 51 is always less than or equal to a diffusion voltage formed in the interior of the SiC-JFETs between the second grid connection G2 and the second cathode connection K2. An SiC-typical value for the diffusion voltage is 3 V.

In the switched-off state, the first grid connection G1, and thus the second grid connection G2 as well, are at the same potential as the first cathode connection K1. The complete operating voltage $U_{A2K1}$ is then applied, inter alia, between the second anode connection A2 and the second grid connection G2, as a result of which the second semiconductor component 200, which is in the form of an SiC-JFET is switched off, and absorbs the majority of the operating voltage $U_{A2K1}$.

The first semiconductor component 100 is then configured only for the remaining portion of the operating voltage $U_{A2K1}$. In general, it is in this case sufficient to configure for a maximum voltage (breakdown voltage, reverse voltage) of less than 350 V, in particular of less than 100 V and preferably less than 50 V, between the first anode connection A1 and the first cathode connection K1. One suitable choice in this case is, for example, the Si-MOSFET sold under the trademark SIEMENS TYPE BUZ 101 SI-MOSFET with a maximum (reverse) voltage of 50 V, a forward resistance of 60 mΩ and a rated current-carrying capacity corresponding to the current required when switched on. Another suitable Si-MOSFET is, for example, a so-called HITFET with an additionally integrated protection function against overtemperature or overvoltage. The HITFET sold under the trademark SIEMENS BTS 149 is suitable for this purpose with a maximum (reverse) voltage of 60 V, a forward resistance of 18 mΩ and a rated current of 19 A. In general, for a breakdown voltage of less than 350 V, the channel resistance of the Si-MOSFET is greater than the drift resistance. This results in low switched-on losses overall.

The control voltage $U_{GK1}$, part of which is partially applied to the second grid connection G2 via the first coupling resistance 51, at least largely prevents, in the switched-on state, a negative grid-cathode voltage $U_{GK2}$ from being formed between the second grid connection G2 and the second cathode connection K2 as the current I rises as a consequence of the negative-feedback effect of the forward resistance of the first semiconductor component 100. Specifically, a negative grid-cathode voltage $U_{GK2}$ results in a constriction of the channel region provided for the current flow, and thus an increase in the forward resistance of the second semiconductor component 200. The control voltage $U_{GK1}$, part of which is coupled via the first coupling resistance 51 to the second grid connection G2, initially results in a positive grid-cathode voltage $U_{GK2}$ at the second semiconductor component 200, as a result of which the channel region widens, and the forward resistance is thus reduced.

A voltage that is dropped between the second anode connection A2 and the second cathode connection K2 is referred to as the anode-cathode voltage $U_{AK2}$ of the second semiconductor component 200.

FIG. 2 shows another exemplary embodiment of the electronic switching device 300. The difference to the electronic switching device 300 in FIG. 1 is the coupling of the control voltage $U_{GK1}$ to the second grid connection G2. In the exemplary embodiment shown in FIG. 2, this is partially achieved via a voltage divider 50 between the first grid connection G1 and the first cathode connection K1. In addition to the first coupling resistance 51, the voltage divider 50 also contains a second coupling resistance 52. The choice of a suitable division ratio for the voltage divider 50 makes it possible to set very exactly the proportion of the control voltage $U_{GK1}$ that is coupled to the second grid connection G2.

In order to keep the drive power as low as possible, the voltage divider is configured to have a high resistance, which in this case means in the kΩ range. A typical value for the first coupling resistance 51 is about 10 kΩ, and for the second coupling resistance 52 about 1 kΩ. Thus, for a typical control voltage $U_{GK1}$ of 15 V, a typical element of 2 V is coupled to the second grid connection G2. In general, the control voltage $U_{GK1}$ can assume values between 5 V and 30 V, and the element which is coupled to the second grid connection G2 can assume values less than or equal to 3 V.

When switching between the switched-off and switched-on state, a capacitance which is located between the second grid connection G2 and the second cathode connection K2 is now discharged or charged via the voltage divider 50, or at least via one of its two coupling resistances 51 or 52. Because the two coupling resistances 51 and 52 of the voltage divider 50 are configured to have a high resistance, however, owing to the low drive power required, this results in a relatively long RC constant, and thus a relatively slow switching process.

Figure 3:
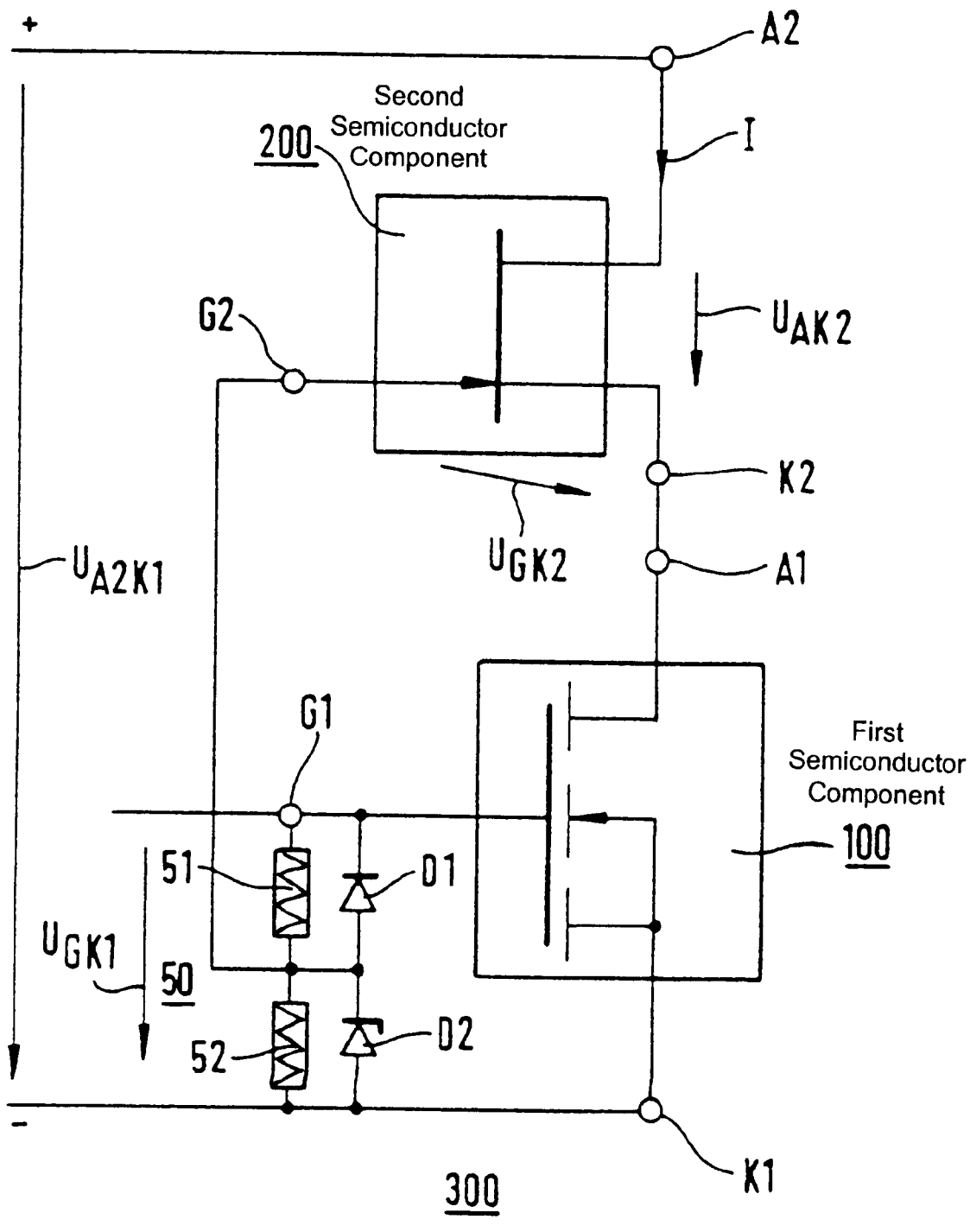
FIG. 3 is a partial schematic diagram/partial block diagram showing a third electronic switching device having a first and a second semiconductor component.

In order to improve the dynamic switching response, the electronic switching device 300 shown in FIG. 3 therefore also contains a first and a second diode D1 and D2, which are respectively connected in parallel with the first and second coupling resistances 51 and 52. The charging process when switching from the switched-on to the switched-off state now takes place via the first diode D1 rather than via the first coupling resistance 51, and the discharge process when switching from the switched-off to the switched-on state now takes place via the second diode D2 rather than via the second coupling resistance 52. This results in a considerably faster switching speed in both cases. When in the switched-on or switched-off state itself, the behavior of the electronic switching device 300 as described above in conjunction with FIGS. 1 and 2 is not changed by the introduction of the two diodes D1 and D2.

The second diode D2 is in the form of a zener diode with a breakdown voltage of less than or equal to 3 V. It thus also provides protection against an excessively large proportion of the control voltage $U_{GK1}$ being coupled to the second grid connection G2.

In one embodiment, which is not illustrated, a further resistance, which is connected upstream of the second grid connection G2, is also provided for fine adjustment of the switching speed, or a resistance for current limiting in the event of a negative control voltage $U_{GK1}$ is provided at the first grid connection G1. Both resistances may be present at the same time.

The electronic switching devices 300 in FIGS. 1 to 3 are each configured for a maximum operating voltage $U_{A2K1}$, which is present in the switched-off state, of up to 5000 V and for a maximum current I flowing in the switched-on state of 1000 A, in particular for a maximum of 500 A. One major field of application is for a maximum operating voltage $U_{A2K1}$ in the switched-off state in the range between 1200 V and 1700 V, and for a current I, flowing as the rated current in the switched-on stage, in the range between 10 A and 50 A.

Figure 4:
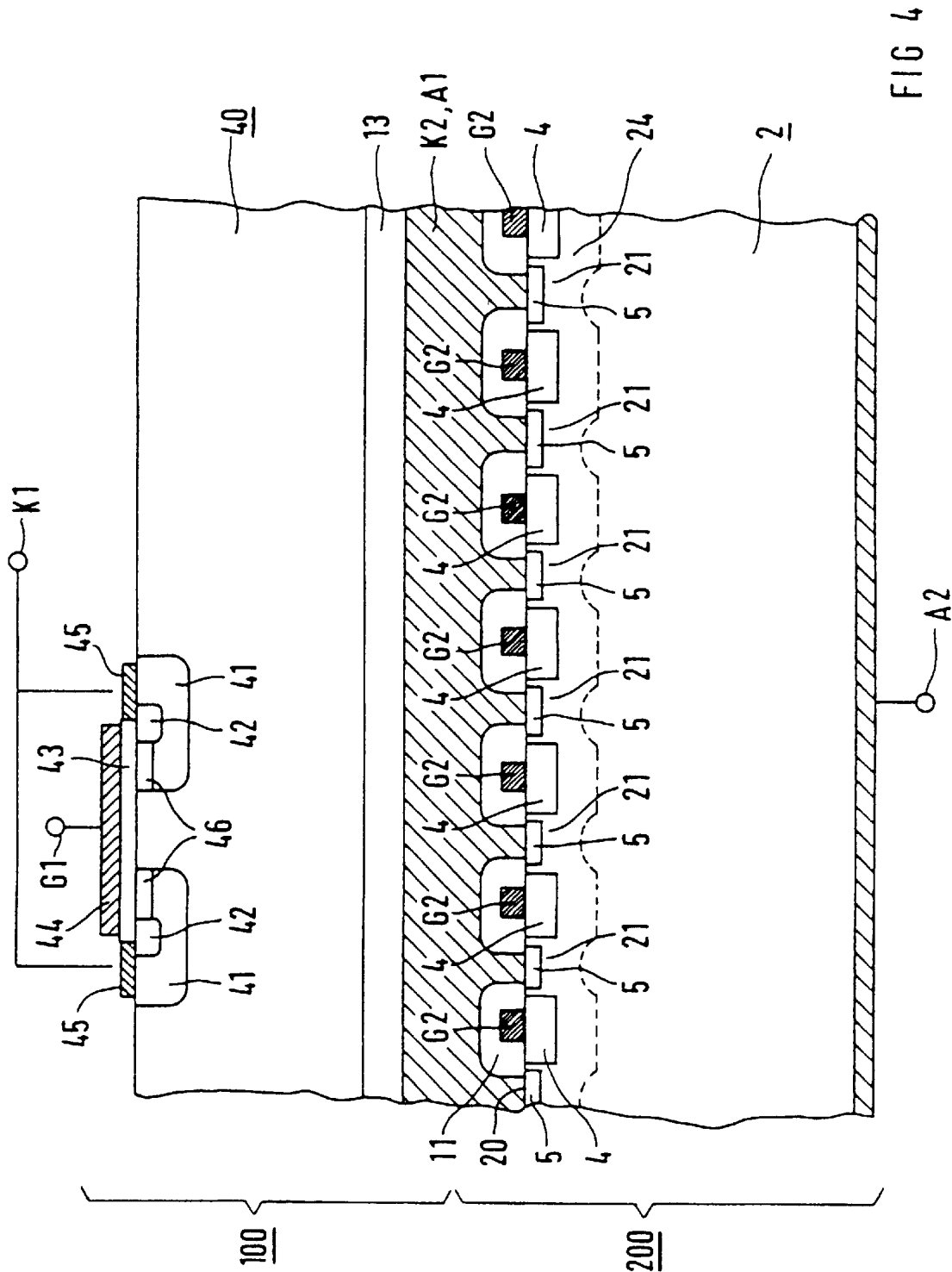
FIG. 4 is a front view of a hybrid semiconductor structure having a first and a second semiconductor component.

In the exemplary embodiment in FIG. 4, the first semiconductor component 100 and the second semiconductor component 200 are integrated to form a hybrid semiconductor structure.

The first semiconductor component 100 is a vertical Si-MOSFET (which is known per se and is therefore demonstrated only schematically) using so-called DDMOS technology ("DD" in this case means double diffused). p-conductive base regions 41 are diffused into an n-conductor silicon wafer 40, and n-conductive regions 42 are in turn diffused into this base region 41. A gate electrode 44 is electrically isolated from the base region 41 by an isolator region 43. An n-channel 46, which produces an n-conductive connecting zone between the source region 42 and the silicon wafer 40 in the base region 41, is controlled via the gate electrode 44. Without any corresponding control potential on the gate electrode 44, there is no n-channel 46. The Si-MOSFET is normally off. Furthermore, a short electrode 45 electrically short-circuits the source regions 42 and the base regions 41. Using the same method of annotation as in the preceding figures, the gate electrode 44 represents the first grid connection G1, and the source electrode 45 represents the first cathode connection K1.

The second semiconductor component 200 is in the form of a SiC-JFET. The SiC-JFET includes an n-conductive first semiconductor region 2 composed of silicon carbide and having a surface 20. A number of likewise n-conductive contact regions 5 and a number of p-conductive second semiconductor regions 4 are located within the first semiconductor region 2 on the surface 20. The second semiconductor regions 4 are each disposed in an area of the first semiconductor region 2 located outside the contact regions 5, so that the contact regions 5 and the second semiconductor regions 4 do not overlap.

Resistive contact is made with the contact regions 5 via an electrode layer that forms the second cathode connection K2. Resistive contact is made with the second semiconductor regions 4 via electrodes that are connected to one another and jointly represent the second grid connection G2. The electrode layer of the second cathode connection K2 and the electrodes of the second grid connection G2 are electrically isolated from one another via an isolation layer 11.

The contact regions 5 may in this case either be doped at the same level or to a higher level than the first semiconductor region 2. If the doping level is higher, this results in better resistive contact with the second cathode connection K2.

The isolation layer 11 is composed of an oxide, in particular of the dielectric silicon dioxide ($SiO_2$), which, in particular, is grown thermally. Thermal oxide has excellent insulation characteristics and can be produced on silicon carbide by dry or wet oxidation at temperatures above 1000° C.

There is a p-n junction with a depletion zone 24 between each of the p-conductive second semiconductor regions 4 and the n-conductive first semiconductor region 2. Because the second semiconductor regions 4 are more highly doped than the first semiconductor region 2, the depletion zones 24 extend further into the first semiconductor region 2 than into the second semiconductor regions 4. Vertical channel regions 21, in which the current I flows in the switched-on state, are located between the second semiconductor regions 4. The vertical channel regions 21 extend both into the first contact regions 5 and into the areas of the first semiconductor region 2 adjacent to them. The vertical channel regions 21 are electrically connected to the second cathode connection K2 via the contact regions 5. In the switched-on state, the current I flows through the vertical channel regions 21, and then through the first semiconductor region 2 to the second anode connection A2, which is disposed on that side of the first semiconductor region 2 which faces away from the surface 20. This is likewise in the form of an electrode layer.

In the switched-off state illustrated in FIG. 4, the depletion zones 24 of the p-n junctions between the first semiconductor region 2 and the second semiconductor regions 4 are enlarged to such an extent that they constrict the vertical channel regions 21 and completely cover them, as is indicated by the dashed lines in FIG. 4. Thus, there is virtually no longer any current flow in the switched-off state. The individual depletion zones 24 are connected to form a single large depletion zone 24 within which the moving charge carriers have been virtually completely eliminated. This large depletion zone then carries a large proportion of the (reverse) voltage. The remaining portion of the (reverse) voltage is essentially absorbed in a drift zone of the first semiconductor region 2. The reverse-voltage capability of the one large depletion zone 24 is in this case governed both by the geometric dimensions and by the doping levels of the first semiconductor region 2, of the second semiconductor regions 4 and of the contact regions 5. For given dimensions, the doping level of the first semiconductor region 2 is chosen, at least within the vertical channel regions 21, to be lower the higher the desired (reverse) voltage. Typical values for the n-doping of the illustrated first semiconductor region 2 when using silicon carbide of the 4H polytype are $n=1 \cdot 10^{16}$ cm$^{-3}$ when the maximum (reverse) voltage present at the depletion zones 24 of the p-n junctions is $U_{max}=600$ V, $n=8 \cdot 10^{15}$ cm$^{-3}$ when it is $U_{max}=1200$ V and $n=5 \cdot 10^{15}$ cm$^{-3}$ when it is $U_{max}=1800$ V.

In the hybrid semiconductor structure shown in FIG. 4, the electrode layer of the second cathode connection K2 is at the same time also allocated to the first anode connection A1 of the first semiconductor component 100. A connecting layer 13 is disposed on this electrode layer, and the silicon wafer 40 with the actual structure of Si-MOSFET is disposed above it. The connecting layer 13 is not absolutely essential, but is only optional. It is used to reduce any mechanical stresses and is therefore preferably composed of a ductile metal, such as gold (Au), silver (Ag), copper (Cu) or aluminum (Al). The connection (bonding) can be produced in particular by a soldering technique (chip-on-chip soldering), a bonding wire connection technique or else by direct wafer bonding. It has been found to be advantageous with this configuration for the zones that are composed of silicon and silicon-carbide semiconductor material not to come into direct contact with one another at any point. Otherwise, this would lead to undesirable mechanical stresses within the hybrid semiconductor structure.

The electrode layers and the individual electrodes of the hybrid semiconductor structure which are allocated to the respective anode, cathode and grid connections A1, A2, K1, K2, G1 and G2 as well are composed of polysilicon or a metal, preferably of nickel (Ni), tantalum (Ta), Titanium (Ti), tungsten (W) or aluminum (Al), or of a metal compound of one of the same metals as a component.

The SIC-JFET exemplary embodiment of the second semiconductor component 200 as illustrated in FIG. 4 contains a number of identical semiconductor cells, which are disposed alongside one another. However, the described principle can be used just as well for a configuration with only a single one of the described semiconductor cells.

Figure 5:
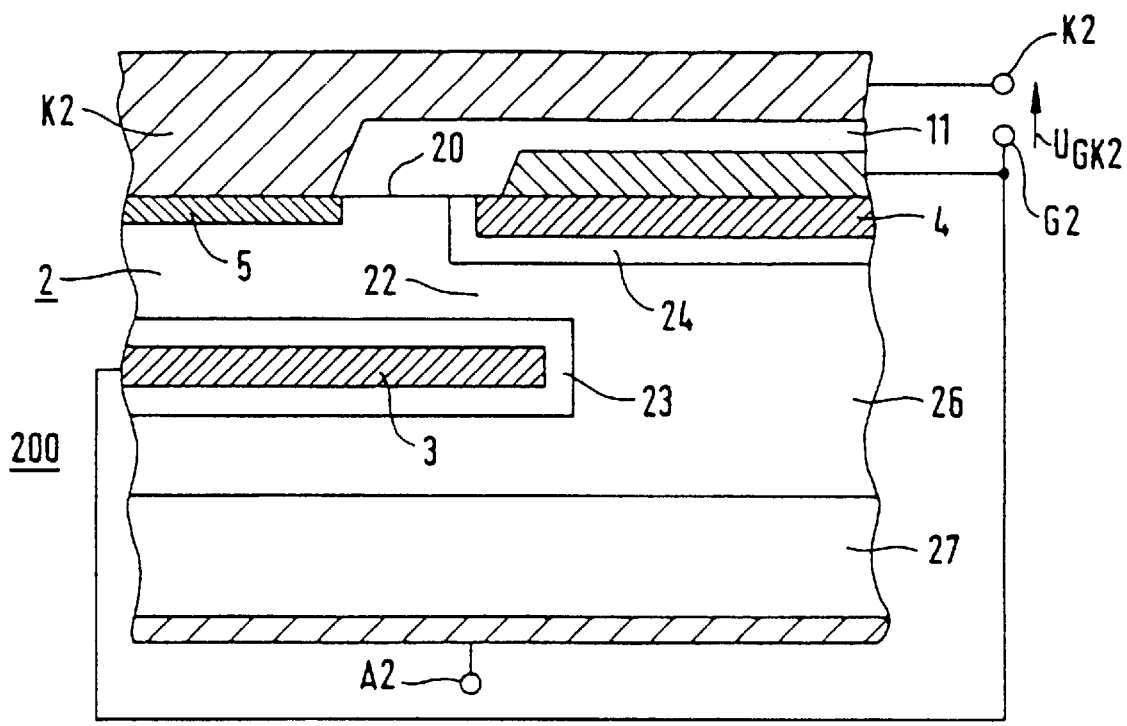
FIG. 5 is a front view of an exemplary embodiment for the second semiconductor component.

FIG. 5 shows a modification of the semiconductor cells in the SiC-JFET shown in FIG. 4. The major difference is that the second semiconductor component 200 that is illustrated in FIG. 5 and is in the form of a SiC-JFET contains a p-conductive island region 3 buried within the first semiconductor region 2.

The first semiconductor region 2 includes an n-conductive substrate 27 composed of silicon carbide and an epitaxially grown, likewise n-conductive semiconductor layer 26 composed of silicon carbide disposed on it. In general, this has a lower charge carrier concentration than the substrate 27.

The buried island region 3 is disposed such that, in a projection at right angles to the surface 20, the projection of the contact region 5 is located entirely in the projection of the buried island region 3. Furthermore, the projections of the buried island region 3 and of the second semiconductor region 4 overlap at their edges. Within the area of this overlap, a lateral channel region 22 runs parallel to the surface 20 in the first semiconductor region 2. This lateral channel region 22 is bounded at its side edges by the space-charge zone 24 of the p-n junction between the first semiconductor region 2 and the second semiconductor region 4, and by a space-charge zone 23 of a further p-n junction between the first semiconductor region 2 and the buried island region 3.

The buried island region 3 and the second semiconductor region 4 are electrically conductively connected to one another, and make electrical contact via the second grid connection G2. When the electronic switching device 300 is switched on, the current I flows through the lateral channel region 22. The larger the geometric dimensions of the lateral channel region 22, the lower is the forward resistance of the second semiconductor component 200 as well. The resistance within the lateral channel region 22 can thus be adjusted via the physical extent of the depletion zones 23 and 24.

Figure 6:
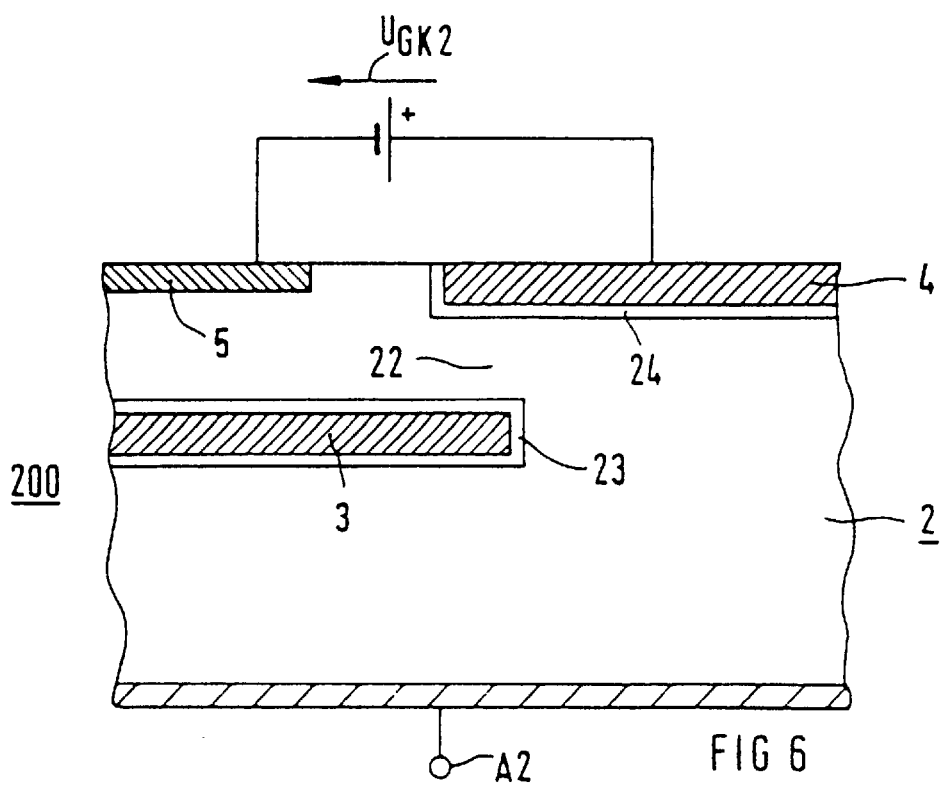
FIG. 6 is a front view of the exemplary embodiment of the second semiconductor component as shown in FIG. 5 with a positive grid cathode voltage.

If, as in the prior art, an electrical connection is provided between the second grid connection G2 and the first cathode connection K1, this results in an increasingly negative grid-cathode voltage $U_{GK2}$ as the electric current I rises, as a result of which the depletion zones 23 and 24 are enlarged further, and thus increase the resistance in the lateral channel region 22. If, in contrast and according to the invention, a positive grid-cathode voltage $U_{GK2}$ is applied to the second semiconductor component 200, then this results, as shown in FIG. 6, in the size of the space-charge zones 23 and 24 being reduced once again. This consequentially results in a reduction in the resistance in the lateral channel region 22. In order to illustrate this situation, FIG. 6 once again shows only those parts of the drawing in FIG. 5 that are relevant in this context. Coupling a portion of the control voltage $U_{GK1}$ to the second grid connection G2 actually results in a positive grid-cathode voltage $U_{GK2}$, with the said advantageous effect.

The first coupling resistance 51 or the voltage divider 50 is in this case dimensioned such that the grid-cathode voltage $U_{GK2}$ does not exceed the diffusion voltage at the p-n junctions between the second semiconductor region 4 and the buried island region 3 on the one hand, and the first semiconductor region 2 on the other hand. In particular, the grid-cathode voltage $U_{GK2}$ assumes at most a value of $2/3$ of the diffusion voltage. The diffusion voltage is dependent on the doping levels of the respective semiconductor regions, and also on the semiconductor material that is used. For silicon carbide, the diffusion voltage is in the order of magnitude of about 3 V. For the "universal semiconductor" silicon, the diffusion voltage varies in the order of magnitude around 0.7 V. These values for the diffusion voltage result directly in the advantageous capability to provide a corresponding reduction in the depletion zones 23 and 24, particularly in the case of silicon carbide, while, in contrast, a corresponding measure for silicon does not allow the same effect to be achieved at all, or at least only to a considerably lesser extent, owing to the material-dependent lower diffusion voltage.

Figure 7:
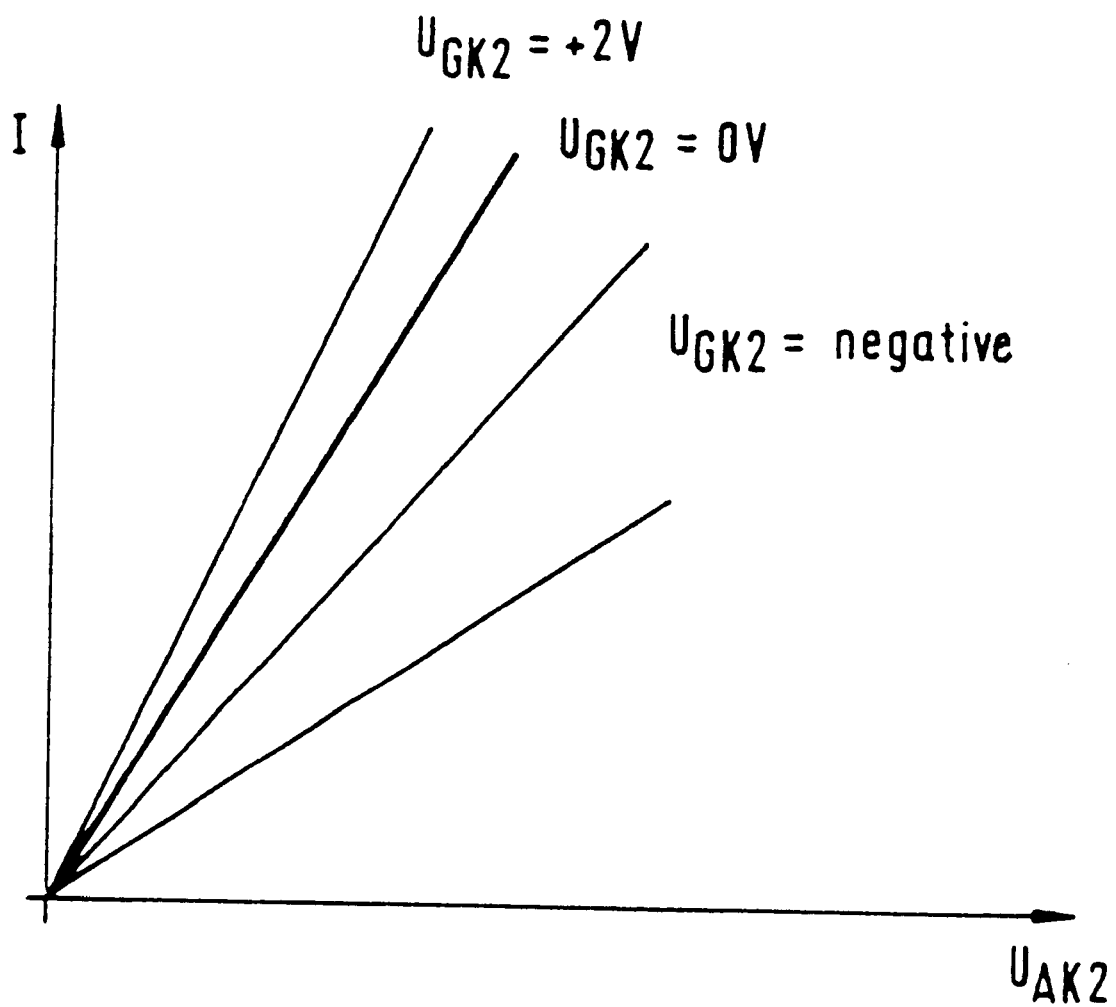
FIG. 7 is a graph plotting the output family of characteristics for the second semiconductor component as shown in FIG. 5.

FIG. 7 shows an output family of characteristics for the SiC-JFET illustrated in FIGS. 5 and 6. The graph shows the electric current I plotted against the anode-cathode voltage $U_{AK2}$ of the second semiconductor component 200 in the linear region. The grid-cathode voltage $U_{GK2}$ is in this case the parameter value of the output family of characteristics. It can be seen from the graph in FIG. 7 that a positive grid-cathode voltage $U_{GK2}$ of 2 V results in a considerably steeper characteristic than negative values of the grid-cathode voltage $U_{GK2}$, which occur in the embodiments in the prior art. Because the gradient of the characteristic actually corresponds to the forward resistance of the second semiconductor component 200, the achievable improvement can be read directly from the measured characteristics in FIG. 7.

It is self-evident that all the said semiconductor conductance types can also respectively be interchanged in a complementary fashion.

We claim:

1. An electronic switching device comprising:
   a first semiconductor component having a first cathode connection, a first anode connection, and a first grid connection, said first grid connection receiving a control voltage; and
   a second semiconductor component having a second cathode connection, a second anode connection, a second grid connection, and a p-n junction located between said second grid connection and said second cathode connection; said p-n junction having a diffusion voltage; said second grid connection also receiving a part of the control voltage, the part of the control voltage applied to said second grid connection producing a grid-cathode voltage of the second semiconductor component; the grid-cathode voltage of the second semiconductor component always being kept less than the diffusion voltage of said p-n junction by manipulating the part of the control voltage received by said second grid connection; said first anode connection and said second cathode connection being electrically short-circuited.

2. The electronic switching device according to claim 1, wherein the grid-cathode voltage of said second semiconductor component is maintained to be at most two-thirds the diffusion voltage of said p-n junction by adjusting the part of the control voltage being applied to said second grid connection.

3. The electronic switching device according to claim 1, including a coupling resistance electrically connecting said first grid connection to said second grid connection.

4. The electronic switching device according to claim 1, including a voltage divider having a first coupling resistance and a second coupling resistance between said first grid connection and said first cathode connection, said first coupling resistance and said second coupling resistance being electrically conductively connected to one another.

5. The electronic switching device according to claim 4, including:
   a first diode connected in parallel with said first coupling resistance, and
   a second diode connected in parallel with the second coupling resistance.

6. The electronic switching device according to claim 3, wherein said coupling resistance is purely resistive.

7. The electronic switching device according to claim 4, wherein said voltage divider is purely resistive.

8. The electronic switching device according to claim 1, wherein said first semiconductor component is composed of silicon.

9. The electronic switching device according to claim 1, wherein said first semiconductor component is a normally-off MOS field-effect transistor.

10. The electronic switching device according to claim 9, wherein said normally-off MOS field-effect transistor includes an n-conductive channel.

11. The electronic switching device according to claim 1, wherein said second semiconductor component is composed of silicon carbide.

12. The electronic switching device according to claim 1, wherein said second semiconductor component is a normally-on field-effect transistor.

13. The electronic switching device according to claim 12, wherein said normally-on field-effect transistor is a normally-on junction field-effect transistor.

14. The electronic switching device according to claim 13, wherein said normally-on junction field-effect transistor includes an n-conductive first semiconductor region with a surface with an n-conductive contact region located on said surface within said semiconductor region having contact made with said n-conductive contact region electrically via said second cathode connection, and an area of said surface located outside said contact region having electrical contact made with said area of said surface via said second grid connection, and said first semiconductor region on a side facing away from said surface having contact made with said side electrically via said second anode connection.

15. The electronic switching device according to claim 14, wherein said normally-on junction field-effect transistor includes a p-conductive second semiconductor region disposed on said surface within said first semiconductor region, said p-conductive second semiconductor region being contacted resistively by said second grid connection.

16. The electronic switching device according to claim 14, wherein said normally-on junction field-effect transistor includes a p-conductive island region buried within said first semiconductor region and disposed underneath said contact region such that, in a projection at right angles to said surface, the projection of said contact region is located completely within a projection of said buried island region.

17. The electronic switching device according to claim 16, wherein said buried island region is likewise electrically conductively connected to said second grid connection.

18. The electronic switching device according to claim 1, wherein the control voltage is between 5 V and 30 V, and the control voltage is applied between said first cathode connection and said first grid connection.

19. The electronic switching device according to claim 1, wherein, in a switched-off state, said first grid connection and said second grid connection are at a same potential as said first cathode connection when said first grid connection and said second grid connection are in a switched-off state.

20. The electronic switching device according to claim 1, wherein a reverse voltage of up to 5000 V can be applied between said first cathode voltage and said second anode connection.

21. The electronic switching device according to claim 1, wherein a rated current of up to 1000 A flows between said first cathode connection and the second anode connection.

22. The electronic switching device according to claim 21, wherein the rated current is up to 500 A.

23. The electronic switching device according to claim 1, wherein said first semiconductor component and said second semiconductor component are integrated to form a hybrid semiconductor structure.

* * * * *